(12) United States Patent
Nishiura

(10) Patent No.: US 6,315,190 B1
(45) Date of Patent: *Nov. 13, 2001

(54) WIRE BONDING METHOD

(75) Inventor: Shinichi Nishiura, Fussa (JP)

(73) Assignee: Kabushiki Kaisha Shinkawa, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/344,726

(22) Filed: Jun. 25, 1999

(30) Foreign Application Priority Data

Jun. 25, 1998 (JP) .................................. 10-178696

(51) Int. Cl.[7] ........................... B23K 31/00; B23K 31/02; B23K 37/00
(52) U.S. Cl. ...................... 228/180.5; 228/4.5; 228/179.1
(58) Field of Search ................................. 228/180.5, 4.5, 228/179.1

(56) References Cited

U.S. PATENT DOCUMENTS

| | | | |
|---|---|---|---|
| 5,056,217 | * 10/1991 | Yamazaki et al. | 29/860 |
| 5,111,989 | * 5/1992 | Holdgrafer et al. | 228/110 |
| 5,156,323 | * 10/1992 | Kumazawa et al. | 228/180.5 |
| 5,259,548 | * 11/1993 | Yamazaki et al. | 228/180.5 |
| 5,291,061 | * 3/1994 | Ball | 257/686 |
| 5,395,035 | * 3/1995 | Nakao | 228/4.5 |
| 5,702,049 | * 12/1997 | Biggs et al. | 228/105 |
| 5,804,004 | * 9/1998 | Tuckerman et al. | 156/60 |
| 5,917,242 | * 6/1999 | Ball | 257/737 |
| 5,961,029 | * 10/1999 | Nishiura et al. | 228/180.5 |
| 5,967,401 | * 10/1999 | Nishiura et al. | 228/180.5 |
| 5,989,995 | * 11/1999 | Nishiura et al. | 438/617 |
| 6,036,080 | * 3/2000 | Takahashi et al. | 228/180.5 |
| 6,112,974 | * 9/2000 | Nishiura et al. | 228/180.5 |

* cited by examiner

Primary Examiner—Tom Dunn
Assistant Examiner—Zidia Pittman
(74) Attorney, Agent, or Firm—Koda & Androlia

(57) ABSTRACT

A wire bonding method for connecting first and second points with a wire, comprising the steps of: connecting the wire to the first bonding point, raising the capillary and performing a reverse operation so as to move the capillary in the opposite direction from the second bonding point, raising the capillary obliquely upward toward the second bonding point (and then raising the capillary further), then raising the capillary and performing another reverse operation so as to move the capillary in the opposite direction from the second bonding point, and raising and then moving the capillary toward the second bonding point, thus connecting the wire to the second bonding point; thus forming a stable wire loop that has a high shape retention strength.

1 Claim, 3 Drawing Sheets

WIRE BONDING METHOD

BACKGROUND OF THE INVENTION

1. Field of the Invention

The present invention relates to a wire bonding method in which a first bonding point and a second bonding point are connected by a wire, and more particularly to a wire loop formation method in wire bonding.

2. Prior Art

As seen from FIG. 3, in a semiconductor device assembly process, a pad 2a (first bonding point) on a semiconductor chip 2 mounted on a lead frame 1 and a lead 1a (second bonding point) on the lead frame 1 are connected by a wire 3. The connected wire loop having the shape as shown in FIG. 3 is called a trapezoidal loop. Wire loop formation methods of this type is disclosed, for example, in Japanese Patent Application Laid-Open (Kokai) Nos. H4-318943 and H7-176558.

The trapezoidal loop shown in FIG. 3 is formed by the process shown in FIG. 4.

In step (a), with a clamper (not shown) which holds the wire 3 opened, the capillary 4 is lowered, so that a ball formed on the tip end of the wire is bonded to the first bonding point A, after which the capillary 4 is raised in substantially vertical direction to point B, and the wire 3 is delivered. Next, in step (b), the capillary 4 is caused to move horizontally to point C in the opposite direction from the second bonding point G. Generally, such movement of the capillary 4 in the opposite direction from the second bonding point G is called a "reverse operation". As a result of the reverse operation, the wire 3 assumes a shape that is inclined from point A to point C, and a kink 3a is formed in a portion of the wire 3. The wire 3 delivered in this process from point A to point C forms the neck height part 31 shown in FIG. 3.

Thereafter, in step (c) in FIG. 4, the capillary 4 is raised in substantially vertical direction to point D, and the wire 3 is delivered. Afterward, in step (d), the capillary 4 is again caused to move horizontally to point E in the opposite direction from the second bonding point G. In other words, a second reverse operation is performed. As a result, the wire 3 assumes a shape that is inclined from point C to point E, and another kink 3b is formed in a portion of the wire 3. This wire 3 delivered from point C to point E forms the trapezoidal length part 32 shown in FIG. 3.

Next, in step (e), the capillary 4 is raised in substantially vertical direction to point F while the wire 3 is delivered. The amount of wire 3 delivered in this case forms the inclined portion 33 shown in FIG. 3. Afterward, the clamper (not shown) is closed. When the clamper is closed, no wire 3 is delivered even of the capillary 4 is subsequently moved. Then, in steps (f) and (g), the capillary 4 is positioned at the second bonding point G by being caused to perform a circular-arc motion or by being lowered after being caused to perform a circular-arc motion, and the wire 3 is bonded to the second bonding point G.

In the trapezoidal loop formation process shown in FIG. 4, the first reverse operation in step (b) is performed with the capillary 4 in a position that is close to the height of the first bonding point A. Accordingly, a comparatively strong kink 3a can easily be formed. However, the second reverse operation in step (d) is performed with the capillary 4 in a high position away from the first bonding point A. Accordingly, the kink 3b is difficult to form and is unstable. As a result, the area of the kink 3b shown in FIG. 3 is unstable, the shape retention strength of the wire loop is weak, and the height of the kink 3b is not aligned with the height of the kink 3a, forming an end-raised or end-lowered loop. Furthermore, if the shape retention strength of the portion in the vicinity of the kink 3b is weak, the bonded wire bends when pressure from the outside is applied to the wire. For example, wire bending tends to occur as a result of external forces such as shocks caused by capillary contact or ultrasonic oscillation during bonding to the second bonding point G, vibration of the wire 3, or mold flow caused by injection of the molding material during molding.

SUMMARY OF THE INVENTION

Accordingly, the object of the present invention is to solve the problem of trapezoidal loops, and the main object of the present invention is to provide a wire bonding method which forms a stable wire loop shape and a wire loop shape which has a high shape retention strength.

The above object is accomplished by a set of unique steps of the present invention taken for a wire bonding method in which a first bonding point and a second bonding point are connected by a wire that passes through a capillary; and the present invention involves: a step in which the tip end of the wire is connected to the first bonding point; a step in which the capillary is raised and a reverse operation is performed so that the capillary is caused to move in the opposite direction from the second bonding point; a step in which the capillary is raised obliquely upward toward the second bonding point and then further raised; a step in which a reverse operation is performed so that the capillary is caused to move in the opposite direction from the second bonding point; and a step in which the capillary is raised and then caused to move toward the second bonding point, and the wire is connected to the second bonding point.

The above object is accomplished by another set of unique steps of the present invention taken for a wire bonding method in which a first bonding point and a second bonding point are connected by a wire that passes through a capillary; and the present invention involves: a step in which the tip end of the wire is connected to the first bonding point; a step in which the capillary is raised and a reverse operation is performed so that the capillary is caused to move in the opposite direction from the second bonding point; a step in which the capillary is raised obliquely upward toward the second bonding point; a step in which a reverse operation is performed so that the capillary is caused to move in the opposite direction from the second bonding point; and a step in which the capillary is raised and then caused to move toward the second bonding point, and the wire is connected to the second bonding point.

In the above methods, the step of raising the capillary obliquely upward toward the second bonding point and the successive step of raising the capillary and performing another reverse operation can be performed a plural number of times.

DETAILED DESCRIPTION OF THE PREFERRED EMBODIMENTS

Figure 2:
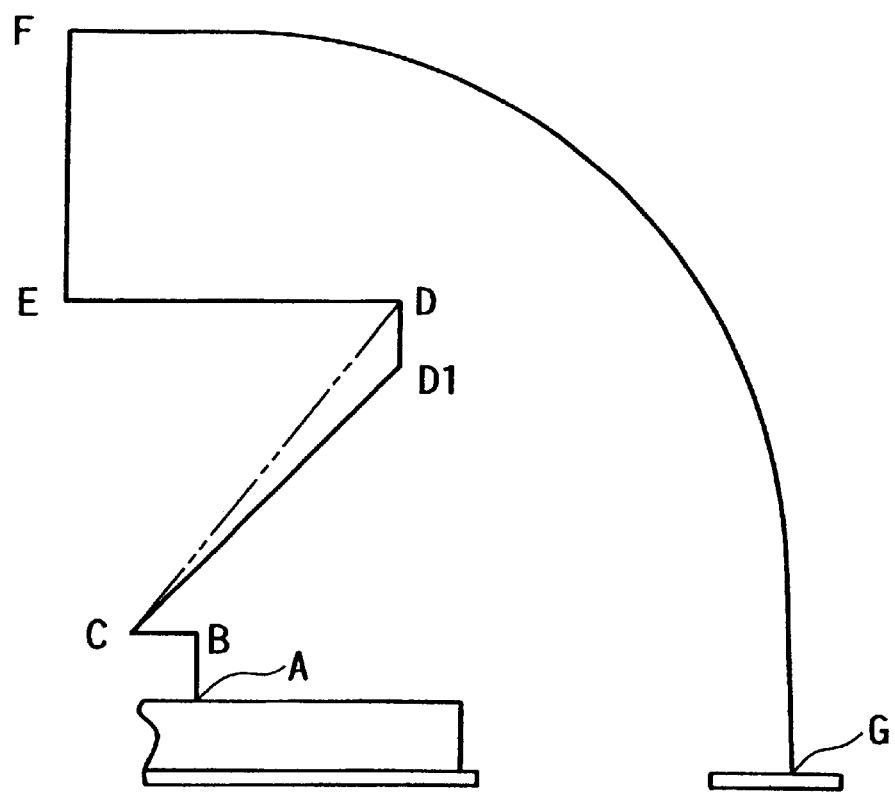
FIG. 2 is an explanatory diagram which shows the track of the capillary in the steps of FIG. 1.
Figure 3:
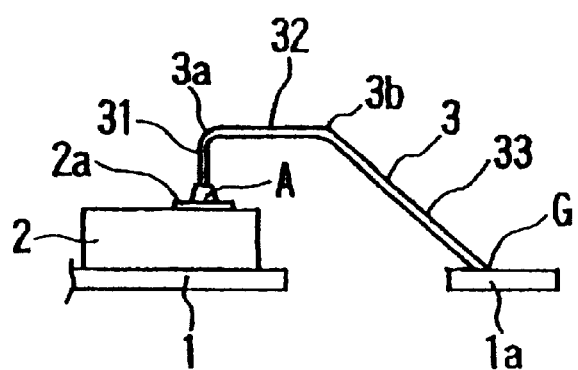
FIG. 3 shows the wire loop shape of a conventional trapezoidal loop.

One embodiment of the present invention will be described with reference to FIGS. 1 and 2. Furthermore, members and elements which are the same as in FIGS. 3 and 4 or correspond to those in FIGS. 3 and 4 will be labeled with the same reference symbols.

Figure 1:
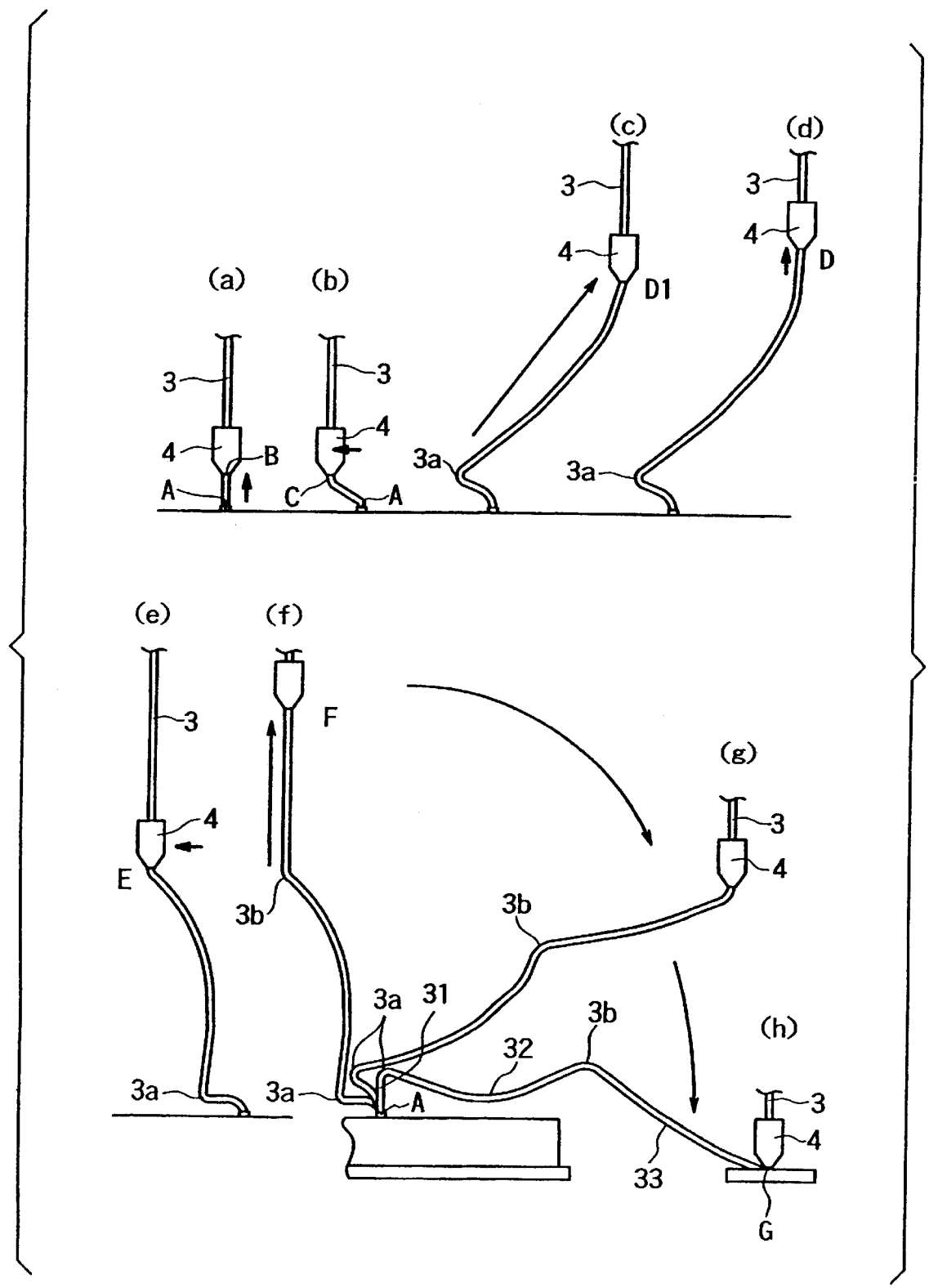
FIG. 1 illustrates steps (a) through (h) in one embodiment of the wire bonding method according to the present invention, showing the wire shapes caused by the movement of a capillary.
Figure 4:
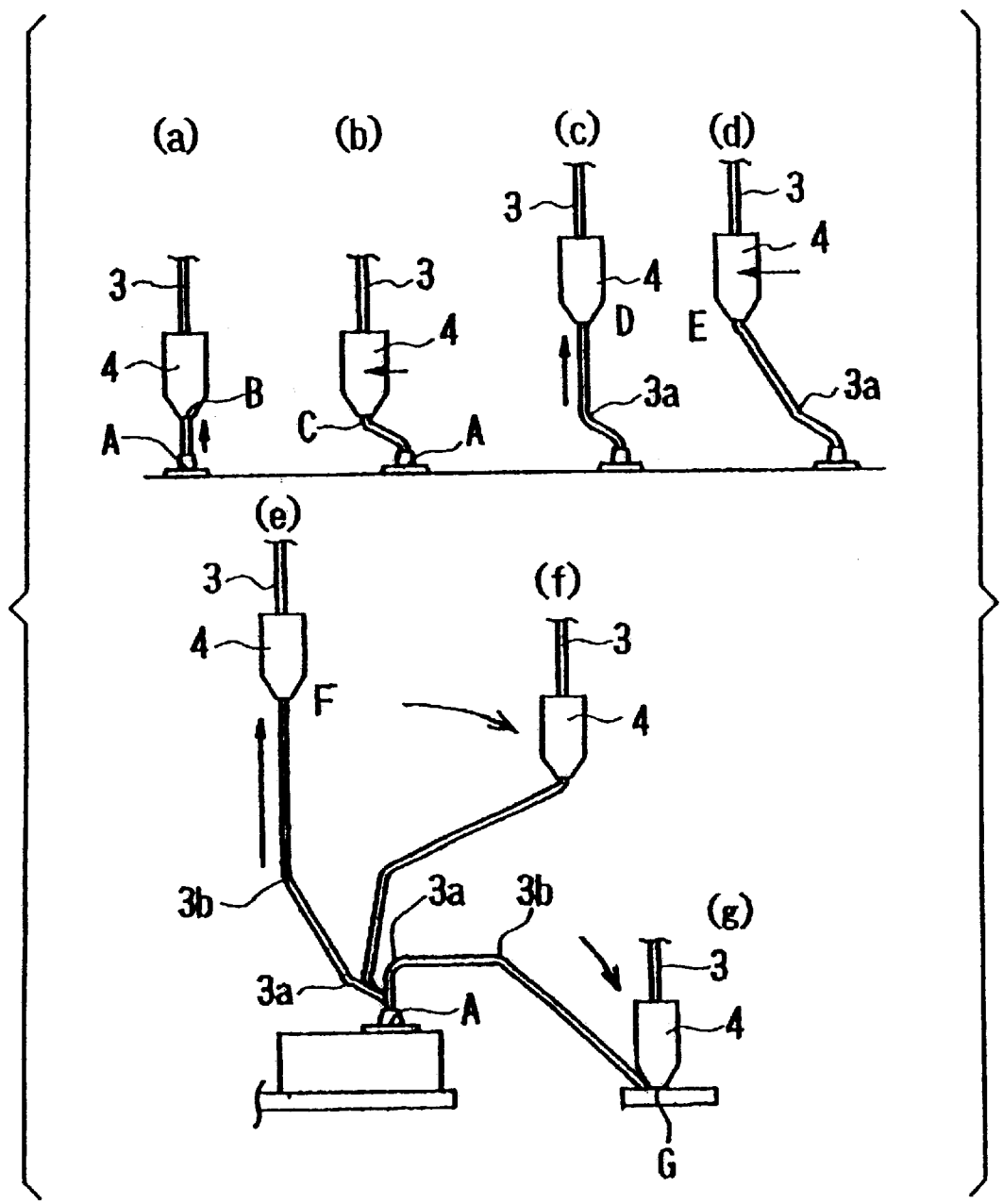
FIG. 4 illustrates the steps (a) through (g) for forming the trapezoidal loop of FIG. 3, showing the wire shapes caused by the movement of a capillary.

In the present embodiment, steps (c) through (d) in FIG. 4 are changed to steps (c) through (e) shown in FIG. 1. The remaining steps are the same as the steps shown in FIG. 4. In other words, the steps (a), (b), (f) through (h) of FIG. 1 correspond to the steps (a), (b), and (e) through (g) of FIG. 4.

First, the steps (a) and (b) in FIG. 1, which are the same as in a conventional method, will be described In step (a), the capillary 4 through which a wire passes is lowered with a damper (not shown) which holds the wire 3 in an open state, and a ball (not shown) formed on the tip end of the wire 3 is bonded to the first bonding point A, after which the capillary 4 is raised in substantially vertical direction to point B, delivering the wire 3. Next, in step (b), a first reverse operation is performed, and the capillary 4 is caused to move horizontally to point C in the opposite direction from the second bonding point G. As a result, a kink 3a is formed in a portion of the wire 3. The wire 3 delivered when the capillary 4 is moved from point A to point C will form the neck height part 31 shown in step (h) which will be described below.

Next, the steps that characterize this embodiment will be described.

In particular, in step (c) of FIG. 1, the capillary 4 is raised obliquely upward in the direction of the second bonding point G from point C to point D1, delivering the wire 3. Afterward, in step (d), the capillary is raised to point D while the wire is delivered from the capillary 4. The length of wire 3 delivered in this operation from point C to point D forms the trapezoidal length portion 32. Next, in step (e), the capillary 4 is moved in the opposite direction from the second bonding point G. In other words, a reverse operation is performed so that the capillary 4 is moved horizontally to point E. As a result of this operation from point C to point E, another kink 3b is formed in the wire 3.

Subsequently, in step (f), the capillary 4 is raised in substantially vertical direction to point F while the wire 3 is delivered in the same manner as in a conventional method. The amount of wire 3 delivered in this case forms the inclined portion 33 shown in step (h). Afterward, the damper (not shown) is closed. When the clamper is thus closed, no wire 3 is delivered even if the capillary 4 is subsequently moved. Next, in steps (f) through (h), the capillary 4 is positioned at the second bonding point G by being caused to perform a circular-arc motion or by being lowered after being caused to perform a circular-arc motion, and the wire 3 is bonded to the second bonding point G.

Since the operation from point F to the second bonding point G has no direct connection with the gist of the present invention, it goes without saying that it would also be possible to perform an operation similar to the operations described in the prior art method, or to perform various other operations.

As seen from above, in the present invention, the reverse operation in step (e) of FIG. 1 is not merely performed after the capillary 4 has been raised as in step (c) of FIG. 4 but is instead performed in steps (c) and (d) after the capillary 4 is caused to move obliquely upward toward the second bonding point G while being raised. As a result, a strong kink 3b is formed, and the position of this kink 3b is stabilized. Thus, a wire loop with a high shape retention strength is obtained.

In the above embodiment of FIG. 1, the capillary 4 is raised obliquely from point C to point D1 and then raised in substantially vertical direction to point D which is located above the point D1. However, it is also possible to raise the capillary obliquely from point C to point D (without moving to point D1) as indicated by the two-dot chain line in FIG. 2. Furthermore, when the trapezoidal length portion 32 is designed to be extremely long, the process in which the capillary 4 is moved from point C to point E via points D1 and D (or via only point D) can be performed a multiple number of times, not being limited to one time as in the described embodiments.

As seen from the above description, according to the present invention, after the tip end of a wire is connected to a first bonding point, the capillary is raised in substantially vertical direction and then a reverse operation is performed so as to move the capillary in the opposite direction from a second bonding point, the capillary is raised obliquely upward toward the second bonding point (and then further raised), then the capillary is raised in substantially vertical direction and another reverse operation is performed so as to move the capillary in the opposite direction from the second bonding point, and the capillary is raised and is caused to move toward the second bonding point, thus connecting the wire to the second bonding point. Accordingly, a stable wire loop and a wire loop which has a high shape retention strength is obtained.

As a result, a stable wire loop shape can be obtained not only in the case of short wire loops with a short wiring distance but also in the case of long wire loops with a long wiring distance. Furthermore, since the obtained wire loop has a high shape retention strength with respect to pressure applied from the outside, the wire loop can sustain pressure from the outside, thus being prevented from bending. The obtained wire loop has a high shock-absorbing capacity with respect to external forces such as shocks caused by contact with the capillary or ultrasonic vibration when the wire is bonded to the second bonding point, vibration of the wire, and mold flow caused by injection of the molding material during molding; and wire bending can be prevented.

What is claimed is:

1. A wire bonding method in which a first bonding point and a second bonding point are connected by a wire that passes through a capillary, consisting of the ordered steps of:

connecting a tip end of the wire to the first bonding point;

raising the capillary while delivering the wire;

performing a reverse operation in which the capillary is caused to move in an opposite direction from the second bonding point to form a first kink in the wire;

raising the capillary obliquely upward toward the second bonding point and then further raising the capillary while delivering the wire;

performing another reverse operation in which the capillary is caused to move in the opposite direction from the second bonding point to form a second kink in said wire;

raising the capillary to deliver the wire;

moving the capillary toward the second bonding point; and connecting the wire to the second bonding point;

whereby a stable wire loop with high shape retention strength is provided.

* * * * *